United States Patent
Abe et al.

(10) Patent No.: US 12,501,746 B2
(45) Date of Patent: Dec. 16, 2025

(54) LIGHT-EMITTING ELEMENT INCLUDING P-SIDE LAYER WITH FIRST AND SECOND LAYERS HAVING DIFFERENT P-TYPE IMPURITY CONCENTRATIONS AND METHOD FOR MANUFACTURING SAME

(71) Applicant: NICHIA CORPORATION, Anan (JP)

(72) Inventors: Hiroki Abe, Komatsushima (JP); Ryota Funakoshi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 493 days.

(21) Appl. No.: 18/056,534

(22) Filed: Nov. 17, 2022

(65) Prior Publication Data
US 2023/0170435 A1  Jun. 1, 2023

(30) Foreign Application Priority Data

Nov. 29, 2021  (JP) ................. 2021-193193
Oct. 7, 2022  (JP) ................. 2022-162492

(51) Int. Cl.
*H10H 20/81* (2025.01)
*H10H 20/01* (2025.01)
(Continued)

(52) U.S. Cl.
CPC .. *H10H 20/8215* (2025.01); *H10H 20/01335* (2025.01); *H10H 20/812* (2025.01);
(Continued)

(58) Field of Classification Search
CPC ......... H10H 20/8215; H10H 20/01335; H10H 20/812; H10H 20/8131; H10H 20/813; H10H 20/825
See application file for complete search history.

(56) References Cited

U.S. PATENT DOCUMENTS

2004/0066816 A1\* 4/2004 Collins, III ............ H10H 29/10
257/E33.044
2005/0110031 A1\* 5/2005 Lai ....................... H10H 20/825
257/97
(Continued)

FOREIGN PATENT DOCUMENTS

JP  2004-128502 A  4/2004
JP  2010-532926 A  10/2010
(Continued)

*Primary Examiner* — Ratisha Mehta
*Assistant Examiner* — Brad A Knudson
(74) *Attorney, Agent, or Firm* — Foley & Lardner LLP

(57) ABSTRACT

A light-emitting element includes: a first light-emitting portion includes, in order upward from a lower side, a first n-side layer, a first active layer, and a first p-side layer disposed, each made of a nitride semiconductor; an intermediate layer disposed over the first light-emitting portion and made of a nitride semiconductor including an n-type impurity; and a second light-emitting portion disposed over the intermediate layer and comprising, in order upward from a lower side, a second n-side layer, a second active layer, and a second p-side layer, each made of a nitride semiconductor. An n-type impurity concentration in the intermediate layer is greater than an n-type impurity concentration in the first n-side layer. The first p-side layer includes: a first layer including aluminum and gallium, and a second layer disposed above the first layer, including aluminum and gallium.

10 Claims, 7 Drawing Sheets

(51) Int. Cl.
  *H10H 20/812* (2025.01)
  *H10H 20/813* (2025.01)
  *H10H 20/825* (2025.01)

(52) U.S. Cl.
  CPC ...... *H10H 20/813* (2025.01); *H10H 20/8131* (2025.01); *H10H 20/825* (2025.01)

(56) References Cited

U.S. PATENT DOCUMENTS

| | | | | |
|---|---|---|---|---|
| 2009/0166608 | A1* | 7/2009 | Nakanishi | H10H 20/82 |
| | | | | 257/E33.068 |
| 2010/0207100 | A1 | 8/2010 | Strassburg et al. | |
| 2016/0181472 | A1* | 6/2016 | Wang | H10H 20/816 |
| | | | | 257/13 |
| 2018/0047868 | A1* | 2/2018 | David | H10H 20/813 |
| 2021/0202790 | A1 | 7/2021 | Hayashi | |
| 2021/0305451 | A1 | 9/2021 | Kishino | |
| 2021/0328095 | A1 | 10/2021 | Hayashi | |

FOREIGN PATENT DOCUMENTS

| | | |
|---|---|---|
| JP | 2017-157667 A | 9/2017 |
| JP | 2021-106245 A | 7/2021 |
| JP | 2021-158291 A | 10/2021 |
| JP | 2021-174813 A | 11/2021 |

\* cited by examiner

LIGHT-EMITTING ELEMENT INCLUDING P-SIDE LAYER WITH FIRST AND SECOND LAYERS HAVING DIFFERENT P-TYPE IMPURITY CONCENTRATIONS AND METHOD FOR MANUFACTURING SAME

CROSS-REFERENCE TO RELATED APPLICATIONS

This application is based upon and claims priority to Japanese Patent Application No. 2021-193193, filed on Nov. 29, 2021, and Japanese Patent Application No. 2022-162492, filed on Oct. 7, 2022. The entire contents of these applications are incorporated herein by reference.

FIELD

The present disclosure relates to a light-emitting element and a method for manufacturing the light-emitting element.

BACKGROUND

Japanese Patent Publication No. 2004-128502 discloses a light-emitting element including: for example, a first light-emitting portion including a first n-type layer, a first active layer, and a first p-type layer; a tunnel bonding layer disposed on the first light-emitting portion; and a second light-emitting portion disposed on the tunnel junction layer and including a second n-type layer, a second active layer, and a second p-type layer.

SUMMARY

It is an object of certain embodiments of the present disclosure to provide a light-emitting element having a low forward voltage and a method for manufacturing such a light-emitting element.

A light-emitting element according to an embodiment of the present disclosure includes a first light-emitting portion including a first n-side layer, a first active layer, and a first p-side layer disposed in this order upward from a lower side, each layer being made of a nitride semiconductor, an intermediate layer disposed over the first light-emitting portion and made of a nitride semiconductor including an n-type impurity, and a second light-emitting portion disposed over the intermediate layer and including a second n-side layer, a second active layer, and a second p-side layer disposed in this order upward from a lower side, each layer being made of a nitride semiconductor. An n-type impurity concentration in the intermediate layer is greater than an n-type impurity concentration in the first n-side layer. The first p-side layer includes a first layer including aluminum and gallium and having a first p-type impurity concentration, and a second layer disposed above the first layer, including aluminum and gallium, and having a second p-type impurity concentration. A value of a composition ratio of aluminum in the second layer is greater than a value of a composition ratio of aluminum in the first layer. The second p-type impurity concentration is less than the first p-type impurity concentration.

A method for manufacturing a light-emitting element according to an embodiment of the present disclosure includes forming a first light-emitting portion including a first n-side layer, a first active layer, and a first p-side layer disposed in this order upward from a lower side, each layer being made of a nitride semiconductor, forming an intermediate layer disposed over the first light-emitting portion and made of a nitride semiconductor including an n-type impurity, and forming a second light-emitting portion disposed over the intermediate layer and including a second n-side layer, a second active layer, and a second p-side layer disposed in this order upward from a lower side, each layer being made of a nitride semiconductor. The forming the intermediate layer includes forming the intermediate layer having an n-type impurity concentration greater than an n-type impurity concentration in the first n-side layer. The forming the first p-side layer includes forming a first layer including aluminum and gallium and having a first p-type impurity concentration, and forming a second layer disposed over the first layer, including aluminum and gallium, having the value of the composition ratio of aluminum greater than the value of the composition ratio of the first layer, and having a second p-type impurity concentration less than the first p-type impurity concentration.

According to the embodiment of the present invention, the light-emitting element having a low forward voltage and a method for manufacturing such a light-emitting element.

DETAILED DESCRIPTION

Figure 1:
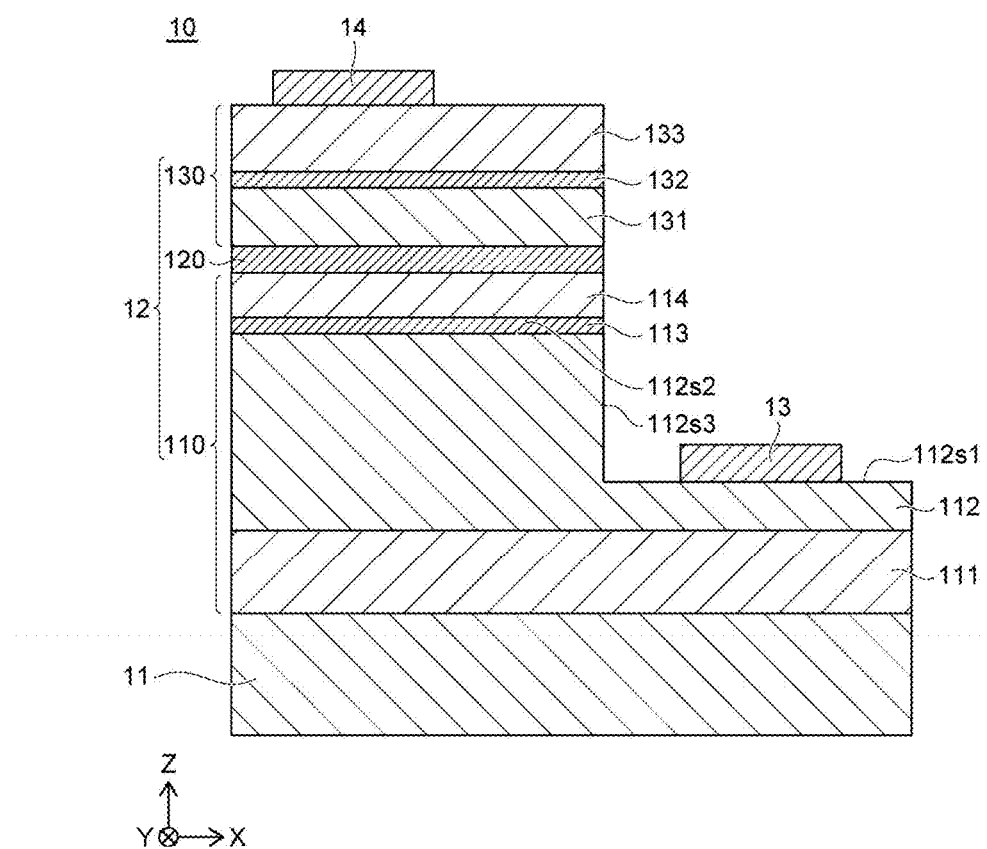
FIG. 1 is a cross-sectional view illustrating a light-emitting element according to an embodiment.

Embodiments will be described below with reference to the accompanying drawings. Note that the drawings are schematic or conceptual, and the relationships between thicknesses and widths of portions, the proportions of sizes between portions, and the like are not necessarily the same as the actual values thereof. Further, the dimensions and the proportions may be illustrated differently between the drawings, even in a case in which the same portion is illustrated. The same reference characters correspond to equivalent elements throughout the present specification and drawings, and a repeated detailed description thereof will be omitted as appropriate.

For clarity of explanation, the arrangement and structure of respective portions will be described using the XYZ orthogonal coordinate system in the following description. The X, Y, and Z-axes are orthogonal to each other. The direction in which the X-axis extends is referred to as the "X-direction," the direction in which the Y-axis extends as the "Y-direction," and the direction in which the Z-axis extends as the "Z-direction." For clarity of explanation, the upper direction is referred to as the Z-direction and the lower direction is referred to as the opposite direction, but these are relative directions and have no relation to a gravitational direction.

FIG. 1 is a cross-sectional view illustrating a light-emitting element 10 according to the present embodiment.

Figure 2A:
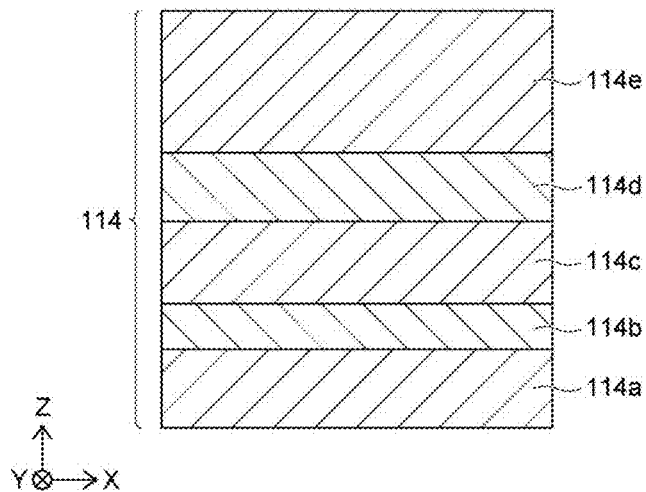
FIG. 2A is an enlarged cross-sectional view illustrating a first p-side layer illustrated in FIG. 1.

FIG. 2A is an enlarged cross-sectional view of a first p-side layer 114 illustrated in FIG. 1.

Figure 2B:
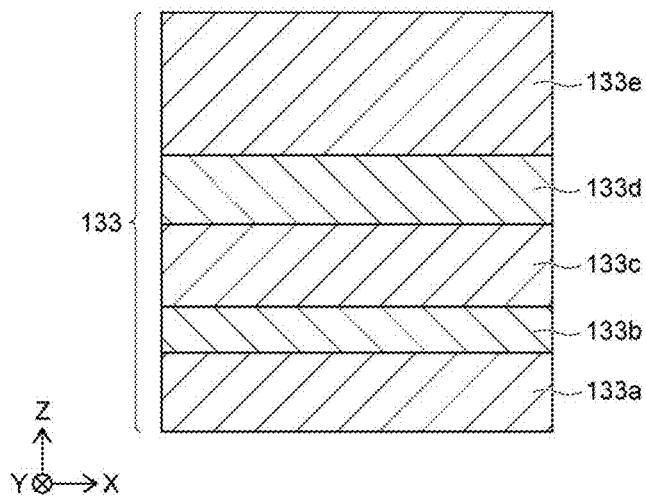
FIG. 2B is an enlarged cross-sectional view illustrating a second p-side layer illustrated in FIG. 1.

FIG. 2B is an enlarged cross-sectional view of a second p-side layer 133 illustrated in FIG. 1.

As illustrated in FIG. 1, the light-emitting element 10 includes a substrate 11, a semiconductor structure 12, an n-side electrode 13, and a p-side electrode 14.

The substrate 11 has a planar shape. The upper and lower surfaces of the substrate 11 are approximately parallel to the X-Y plane, for example. The substrate 11 is made of, for example, sapphire ($Al_2O_3$). Alternatively, other materials such as silicon (Si), silicon carbide (SiC), or gallium nitride (GaN) may be used for the substrate 11. The semiconductor structure 12 is disposed on the substrate 11. For example, when a sapphire substrate is used as the substrate 11, the semiconductor structure 12 is disposed on the C plane of the sapphire substrate.

The semiconductor structure 12 is a layered body in which a plurality of semiconductor layers made of nitride semiconductor are layered. As used herein, the "nitride semiconductor" refers to a semiconductor including nitrogen, and is typically a semiconductor having any composition in which the composition ratio of x and y varies within a range in the chemical formula $In_xAl_yGa_{1-x-y}N$ ($0 \leq x \leq 1$, $0 \leq y \leq 1$, $x+y \leq 1$).

The semiconductor structure 12 includes a first light-emitting portion 110, an intermediate layer 120, and a second light-emitting portion 130 in this order upward from a lower side. The first light-emitting portion 110 includes a first n-side layer 112, a first active layer 113, and a first p-side layer 114 in this order upward from a lower side. The first light-emitting portion 110 further includes a base layer 111 disposed under the first n-side layer 112. The second light-emitting portion 130 includes a second n-side layer 131, a second active layer 132, and a second p-side layer 133 in this order upward from a lower side. Each portion of the semiconductor structure 12 will be described in detail below.

The base layer 111 of the first light-emitting portion 110 is disposed on the substrate 11. The base layer 111 includes, for example, an undoped semiconductor layer. As described in this specification, "undoped" means being not intentionally doped with any n-type or p-type impurity. In other words, the undoped semiconductor layer is a semiconductor layer formed without supplying a raw material gas including the n-type and p-type impurity. The "n-type impurity" means an impurity serving as a donor. The "p-type impurity" means an impurity serving as an acceptor. When the undoped semiconductor layer is adjacent to the doped layer that is intentionally doped with the n-type impurity and/or p-type impurity, the undoped semiconductor layer may come to include the n-type and/or p-type impurity by diffusion or the like from the adjacent layer.

The undoped semiconductor layer in the base layer 111 includes GaN, for example. The first n-side layer 112 is disposed on the base layer 111. Alternatively, the base layer may not be provided in the first light-emitting portion, and the first n-side layer may be disposed directly on the substrate.

The first n-side layer 112 includes one or more n-type semiconductor layers. The n-type semiconductor layer in the first n-side layer 112 includes, for example, GaN doped with silicon (Si) which is an n-type impurity. The n-type semiconductor layer in the first n-side layer 112 may further include indium (In) or aluminum (Al).

It is sufficient that the first n-side layer 112 have an electron supplying function, it may further include one or more undoped semiconductor layers. The undoped semiconductor layer in the first n-side layer 112 includes GaN, for example.

The upper surface of the first n-side layer 112 includes a first surface 112s1, a second surface 112s2, and a third surface 112s3. The first surface 112s1 is a surface substantially parallel to the X-Y plane. The second surface 112s2 is a surface which is located above the first surface 112s1 and is approximately parallel to the X-Y plane. In top view, the second surface 112s2 is adjacent to the first surface 112s1 in the X-direction. The third surface 112s3 is a surface which is located between the first surface 112s1 and the second surface 112s2 and approximately parallel to the Y-Z plane. The first active layer 113 is disposed on the second surface 112s2.

The first active layer 113 has, for example, a multiple quantum well structure including a plurality of well layers and a plurality of barrier layers. Indium gallium nitride (InGaN) can be used for the plurality of well layers, for example. GaN can be used for the plurality of barrier layers, for example. The well layers and the barrier layers may be, for example, undoped semiconductor layers. In addition, the well layers and the barrier layers may partially include the n-type and/or p-type impurity. The first p-side layer 114 is disposed on the first active layer 113.

As illustrated in FIG. 2A, the first p-side layer 114 includes a first layer 114a and a second layer 114c disposed above the first layer 114a. In the present embodiment, the first p-side layer 114 further includes a fifth layer 114b disposed between the first layer 114a and the second layer 114c, a sixth layer 114d disposed on the second layer 114c, and a seventh layer 114e disposed on the sixth layer 114d. That is, the first p-side layer 114 includes the first layer 114a, the fifth layer 114b, the second layer 114c, the sixth layer 114d, and the seventh layer 114e in this order upward from a lower side.

The first layer 114a includes aluminum gallium nitride (AlGaN) which is a mixed crystal of aluminum nitride (AlN) and GaN and to which a p-type impurity, magnesium (Mg), is doped. Hereinafter, a p-type impurity concentration in the first layer 114a is referred to as a "first p-type impurity concentration." The first p-type impurity concentration is in a range from $1 \times 10^{20}$ cm$^{-3}$ to $3 \times 10^{20}$ cm$^{-3}$, for example. The value of the composition ratio of Al in the first layer 114a is in a range from 5% to 15%, for example.

The fifth layer 114b includes undoped AlGaN. The value of the composition ratio of Al in the fifth layer 114b is approximately the same as the value of the composition ratio of Al in the first layer 114a, for example. The relationship of the values of the composition ratios of Al between the fifth layer and the first layer is not limited to the above.

The second layer 114c is made of AlGaN doped with Mg as p-type impurity. Hereinafter, a p-type impurity concentration in the second layer 114c is referred to as a "second p-type impurity concentration." The second p-type impurity concentration is less than the first p-type impurity concentration. By reducing the second p-type impurity concentration in the second layer 114c, which is located closer to the intermediate layer 120 than the first layer 114a, the amount of the p-type impurities that diffuse from the first p-side layer 114 toward the intermediate layer 120 can be reduced. Accordingly, unintentional formation of a p-type semiconductor layer in the n-type semiconductor layer, which forms the p-n junction, can be decreased, thus narrowing the width of a depletion layer formed by the p-n junction, and reducing the forward voltage Vf of the light-emitting element 10.

By increasing the first p-type impurity concentration in the first layer 114a disposed on the first active layer 113, a hole injection efficiency from the first p-side layer 114 to the first active layer 113 can be improved. Accordingly, the forward voltage Vf of the light-emitting element 10 can be reduced. The second p-type impurity concentration is in a range from $4\times10^{19}$ cm$^{-3}$ to $1\times10^{20}$ cm$^{-3}$, for example.

The value of the composition ratio of Al in the second layer 114c is greater than the value of the composition ratio of Al in the first layer 114a. This allows the second layer 114c to function as an electron blocking layer that decreases the electrons moving from the first active layer 113 toward upper layers such as the sixth layer 114d, the seventh layer 114e, and the intermediate layer 120 located above the second layer 114c. By reducing the value of the composition ratio of Al in the first layer 114a disposed on the first active layer 113, the hole injection efficiency from the first p-side layer 114 to the first active layer 113 can be improved. As a result, the forward voltage Vf of the light-emitting element 10 can be reduced. The value of the composition ratio of Al in the second layer 114c is in a range from 25% to 35%, for example.

The sixth layer 114d includes undoped GaN in the present embodiment. Alternatively, the sixth layer 114d may be doped with Mg as p-type impurity.

The seventh layer 114e includes one or more p-type semiconductor layers, for example. The p-type semiconductor layer in the seventh layer 114e includes GaN doped with Mg which is a p-type impurity, for example. The p-type impurity concentration in the p-type semiconductor layer in the seventh layer 114e is greater than the first p-type impurity concentration and the second p-type impurity concentration. The p-type impurity concentration in the p-type semiconductor layer in the seventh layer 114e is in a range from $3\times10^{20}$ cm$^{-3}$ to $5\times10^{20}$ cm$^{-3}$, for example. The seventh layer 114e may further include one or more undoped semiconductor layers, for example. The undoped semiconductor layer in the seventh layer 114e includes GaN, for example.

The thickness of the first layer 114a is in a range from 3 nm to 7 nm, for example. The thickness of the fifth layer 114b is less than the thickness of the first layer 114a, for example. The thickness of the fifth layer 114b is in a range from 0.5 nm to 3 nm, for example. The thickness of the second layer 114c is approximately the same as the thickness of the first layer 114a, for example. The thickness of the sixth layer 114d is, for example, less than the thickness of the first layer 114a and greater than the thickness of the fifth layer 114b. The thickness of the sixth layer 114d is in a range from 1 nm to 5 nm, for example. The thickness of each layer refers to the thickness in the stacking direction of the semiconductor structure 12.

The intermediate layer 120 is disposed between the first light-emitting portion 110 and the second light-emitting portion 130, as illustrated in FIG. 1. The intermediate layer 120 includes the n-type impurity. Specifically, the intermediate layer 120 includes the n-type semiconductor layer having the n-type impurity concentration greater than the n-type impurity concentration in the first n-side layer 112 and the second n-side layer 131 which is described below. The n-type semiconductor layer in the intermediate layer 120 includes, for example, GaN doped with Si as the n-type impurity. The n-type impurity concentration in the n-type semiconductor layer in the intermediate layer 120 is in a range from $1\times10^{20}$ cm$^{-3}$ to $1\times10^{21}$ cm$^{-3}$, for example. The intermediate layer 120 forms a tunnel junction with the first p-side layer 114.

The intermediate layer 120 may further include a p-type semiconductor layer having a p-type impurity concentration greater than the p-type impurity concentration in the first p-side layer 114. The p-type semiconductor layer includes GaN doped with Mg as a p-type impurity, for example. The p-type semiconductor layer of the intermediate layer 120 is disposed closer to the first light-emitting portion 110 side than is the n-type semiconductor layer of the intermediate layer 120. Thus, in a case in which the intermediate layer 120 includes the p-type semiconductor layer, the n-type semiconductor layer and the p-type semiconductor layer in the intermediate layer 120 form the tunnel junction.

The second n-side layer 131 of the second light-emitting portion 130 is disposed on the intermediate layer 120. The second n-side layer 131 includes one or more n-type semiconductor layers. The n-type semiconductor layer in the second n-side layer 131 includes, for example, GaN doped with Si as the n-type impurity. The n-type semiconductor layer in the second n-side layer 131 may further include In, Al, or the like.

It is sufficient that the second n-side layer 131 have a function of supplying electrons, the second n-side layer 131 may include one or more undoped semiconductor layers. The undoped semiconductor layer in the second n-side layer 131 includes GaN, for example. The second active layer 132 is disposed on the second n-side layer 131.

The second active layer 132 has, for example, a multiple quantum well structure including a plurality of well layers and a plurality of barrier layers. InGaN can be used for the plurality of well layers, for example. For example, GaN can be used for the plurality of barrier layers. The well layers and the barrier layers may be, for example, undoped semiconductor layers. In addition, the well layers and the barrier layers may partially include the n-type and/or p-type impurity.

The first active layer 113 and the second active layer 132 emit light which is, for example, ultraviolet light or visible light. An emission peak wavelength of the first active layer 113 may be equal to an emission peak wavelength of the second active layer 132. For example, the first active layer 113 and the second active layer 132 may emit blue light. The emission peak wavelength of the first active layer 113 may be different from the emission peak wavelength of the second active layer 132. For example, the first active layer 113 may emit blue light, and the second active layer 132 may emit green light. The emission peak wavelength of the blue light is in a range from 430 nm to 490 nm, for example. The emission peak wavelength of the green light is in a range from 500 nm to 540 nm.

The second p-side layer 133 is disposed on the second active layer 132. As illustrated in FIG. 2B, the second p-side layer 133 includes a third layer 133a and a fourth layer 133c disposed above the third layer 133a. In the present embodiment, the second p-side layer 133 further includes an eighth layer 133b disposed between the third layer 133a and the fourth layer 133c, a ninth layer 133d disposed on the fourth layer 133c, and a tenth layer 133e disposed on the ninth layer 133d. That is, the second p-side layer 133 includes the third layer 133a, the eighth layer 133b, the fourth layer 133c, the ninth layer 133d, and the tenth layer 133e in this order upward from a lower side.

The third layer 133a includes AlGaN doped with Mg as p-type impurity. Hereinafter, the p-type impurity concentration in the third layer 133a is referred to as a "third p-type impurity concentration." The first p-type impurity concentration is less than the third p-type impurity concentration in the present embodiment. Thus, the p-type impurity concentration in the second p-side layer 133 disposed above the intermediate layer 120 is increased while reducing the p-type impurity concentration in the first p-side layer 114 disposed below the intermediate layer 120. This improves the hole injection efficiency from the second p-side layer 133 to the second active layer 132 while reducing the amount of the p-type impurities that diffuse from the first p-side layer 114 to the intermediate layer 120. The third p-type impurity concentration is in a range from $2\times10^{20}$ cm$^{-3}$ to $4\times10^{20}$ cm$^{-3}$, for example. However, the relationship between the first p-type impurity concentration and the third p-type impurity concentration is not limited to the above.

The value of the composition ratio of Al in the third layer 133a is less than the value of the composition ratio of Al in the first layer 114a. The value of the composition ratio of Al in the third layer 133a is in a range from 1% to 5%, for example. Alternatively, the relationship of the values of the composition ratios of Al between the first layer 114a and the third layer 133a is not limited to the above.

The eighth layer 133b includes undoped AlGaN. The value of the composition ratio of Al in the eighth layer 133b is approximately the same as the value of the composition ratio of Al in the third layer 133a, for example. However, the relationship of the values of the composition ratios of Al between the eighth layer 133b and the third layer 133a is not limited to the above.

The fourth layer 133c includes AlGaN doped with Mg as p-type impurity. Hereinafter, the p-type impurity concentration in the fourth layer 133c is referred to as a "fourth p-type impurity concentration." The fourth p-type impurity concentration is less than the third p-type impurity concentration. Therefore, in driving the light-emitting element 10 at a high temperature of, for example, 100° C. or higher, the decrease in output of the light-emitting element 10 can be reduced. Also, the fourth p-type impurity concentration is greater than the second p-type impurity concentration. This improves the hole injection efficiency from the second p-side layer 133 to the second active layer 132 while reducing the amount of the p-type impurities that diffuse from the first p-side layer 114 to the intermediate layer 120. The fourth p-type impurity concentration is in a range from $5\times10^{19}$ cm$^{-3}$ to $2\times10^{20}$ cm$^{-3}$, for example. However, the relationship among the fourth p-type impurity concentration, the third p-type impurity concentration, and the second p-type impurity concentration is not limited to the above.

In the present embodiment, the value of the composition ratio of Al in the fourth layer 133c is greater than the value of the composition ratio of Al in the third layer 133a. This allows the fourth layer 133c to function as the electron blocking layer that reduces the electrons moving from the second active layer 132 toward the ninth layer 133d, the tenth layer 133e, and the like, which are located above the fourth layer 133c. In addition, by reducing the value of the composition ratio of Al in the third layer 133a disposed on the second active layer 132, the hole injection efficiency from the second p-side layer 133 to the second active layer 132 can be improved.

In the present embodiment, the value of the composition ratio of Al in the fourth layer 133c is greater than the value of the composition ratio of Al in the first layer 114a, and is less than the value of the composition ratio of Al in the second layer 114c. In other words, the value of the composition ratio of Al in the second layer 114c>the value of the composition ratio of Al in the fourth layer 133c>the value of the composition ratio of Al in the first layer 114a>the value of the composition ratio of Al in the third layer 133a. The value of the composition ratio of Al in the fourth layer 133c is in a range from 15% to 25%, for example. However, the values of the Al composition ratios of the first layer 114a, the second layer 114c, the third layer 133a, and the fourth layer 133c are not limited to the relationship described above.

The ninth layer 133d includes GaN doped with Mg as p-type impurity. Alternatively, the ninth layer 133d may be doped with Mg as p-type impurity.

The tenth layer 133e includes, for example, one or more p-type semiconductor layers. The p-type semiconductor layer in the tenth layer 133e includes, for example, GaN doped with Mg as the p-type impurity. The tenth layer 133e may further include, for example, an undoped semiconductor layer. The undoped semiconductor layer in the tenth layer 133e includes GaN, for example.

The thickness of the third layer 133a is, for example, approximately the same as the thickness of the first layer 114a. The thickness of the eighth layer 133b is, for example, approximately the same as the thickness of the fifth layer 114b. The thickness of the fourth layer 133c is, for example, approximately the same as the thickness of the second layer 114c. The thickness of the ninth layer 133d is, for example, approximately the same as the thickness of the sixth layer 114d. However, the relationship of the thickness among these layers 114a, 114b, 114c, 144d, 133a, 133b, 133c, and 133d is not limited to the above.

The n-side electrode 13 is disposed on the first surface 112s1 of the first n-side layer 112 as illustrated in FIG. 1. The n-side electrode 13 is electrically connected to the first n-side layer 112. The p-side electrode 14 is disposed on the second p-side layer 133. The p-side electrode 14 is electrically connected to the second p-side layer 133. The first active layer 113 and the second active layer 132 emit light by applying a forward voltage Vf across the n-side electrode 13 and the p-side electrode 14.

When the forward voltage Vf is applied across the n-side electrode 13 and the p-side electrode 14, that is, a positive potential is applied to the p-side electrode 14 and a potential less than the potential applied to the p-side electrode 14 is applied to the n-side electrode 13, a reverse voltage is applied between the second n-side layer 131 and the first p-side layer 114. Therefore, the tunnel effect of the intermediate layer 120 is used to allow the current to flow between the second n-side layer 131 and the first p-side layer 114. The electric current flows by tunneling electrons present in the valence band of the first p-side layer 114 to the conduction band of the second n-side layer 131.

In order to obtain such a tunnel effect, as described above, the intermediate layer 120 includes the n-type semiconductor layer having the n-type impurity concentration greater than the n-type impurity concentration in the first n-side layer 112 and the second n-side layer 131. For example, a p-n junction may be formed by the n-type semiconductor layer and the first p-side layer 114 in the intermediate layer 120. For example, the intermediate layer 120 may further include a p-type semiconductor layer having a p-type impurity concentration greater than the p-type impurity concentration in the first p-side layer 114 below the n-type semiconductor layer of the intermediate layer 120. When the intermediate layer 120 includes the n-type semiconductor layer and the p-type semiconductor layer described above, the n-type semiconductor layer and the p-type semiconductor layer in the intermediate layer 120 may form the p-n junction. By increasing the impurity concentration of each conductivity type included in the semiconductor layers that form the p-n junction, the width of a depletion layer formed by the p-n junction can be narrowed. Furthermore, the narrower the width of the depletion layer, the easier the electrons present in the valence band of the first p-side layer 114 can tunnel the depletion layer and move to the conduction band of the second n-side layer 131 when the voltage is applied.

The embodiment described above explained the example of the value of the composition ratio of Al in the second layer 114c is in a range from 25% to 35%, but the value of the composition ratio of Al in the second layer 114c can be in a range from 8% to 25%. In this case, the value of the composition ratio of Al in the first layer 114a can be in a range from 3% to 7% for example. Accordingly, the hole injection efficiency from the first p-side layer 114 to the first active layer 113 can be more improved. In this case, the value of the composition ratio of Al in the fourth layer 133c is greater than the value of the composition ratio of Al in the first layer 114a and the value of the composition ratio of Al in the second layer 114c.

Next, a method for manufacturing the light-emitting element 10 is described.

Figure 3:
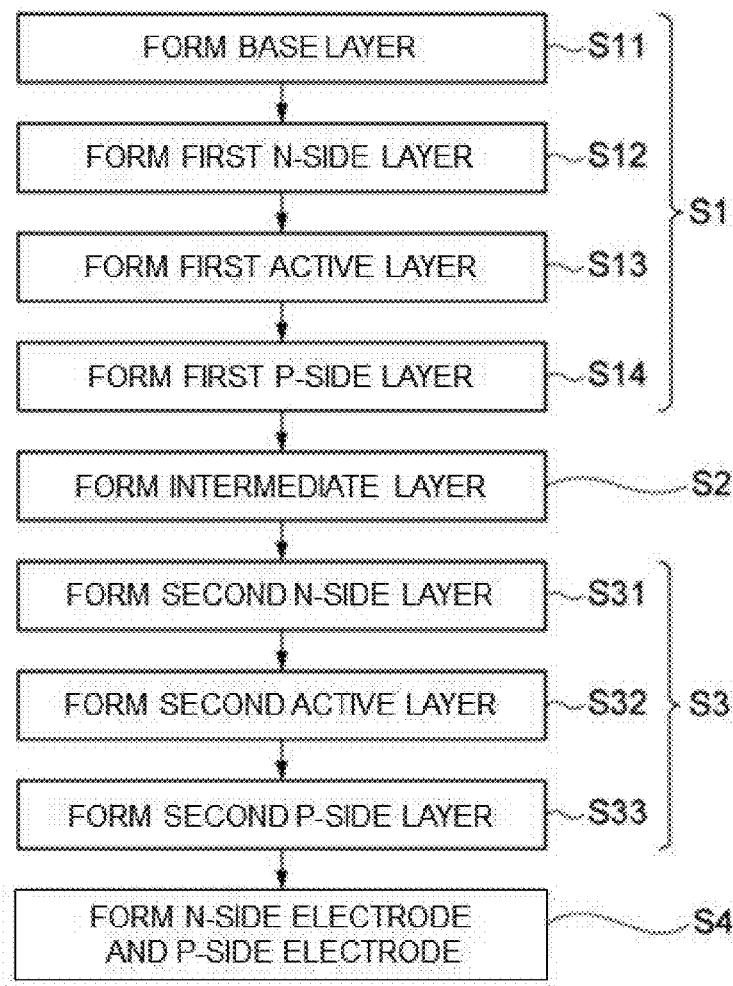
FIG. 3 is a flowchart illustrating a method for manufacturing a light-emitting element according to the embodiment.

FIG. 3 is a flowchart illustrating a method for manufacturing the light-emitting element 10 according to the present embodiment.

Figure 4A:
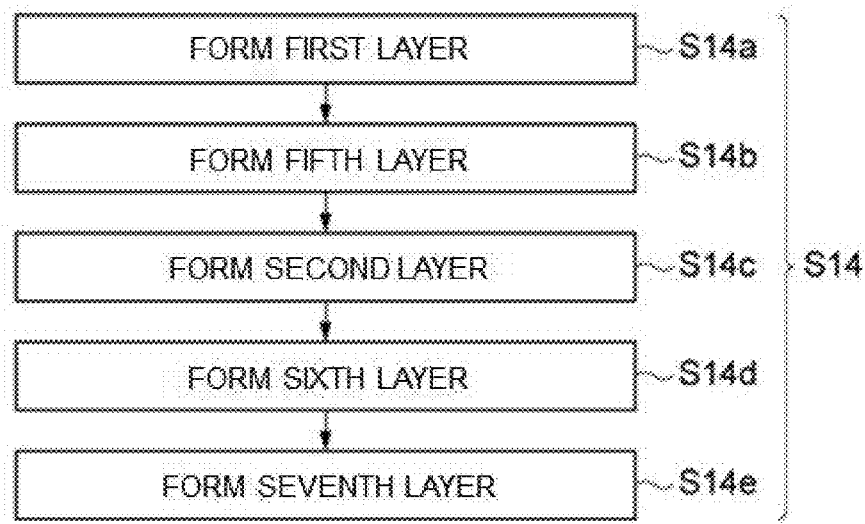
FIG. 4A is a flowchart illustrating details of forming the first p-side layer illustrated in FIG. 3.

FIG. 4A is a flowchart illustrating details of forming the first p-side layer 114 illustrated in FIG. 3.

Figure 4B:
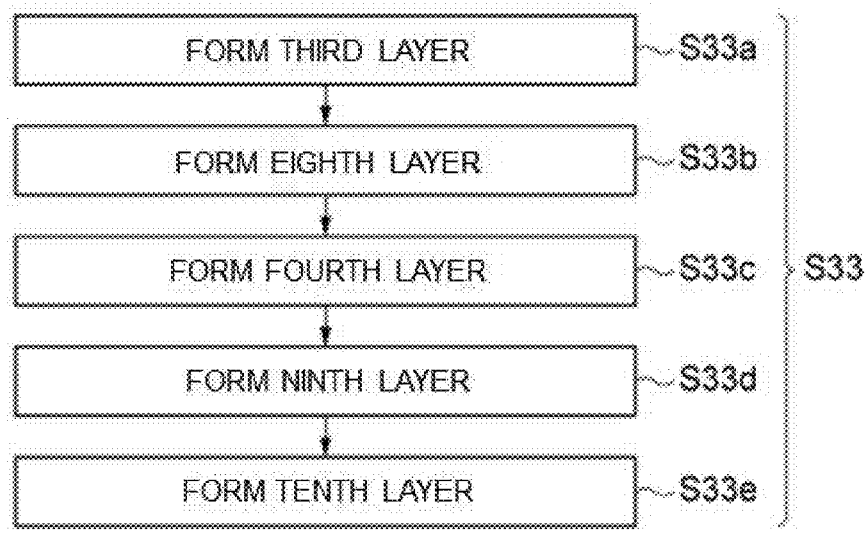
FIG. 4B is a flowchart illustrating details of forming the second p-side layer illustrated in FIG. 3.

FIG. 4B is a flowchart illustrating details of forming the second p-side layer 133 illustrated in FIG. 3.

Figure 5:
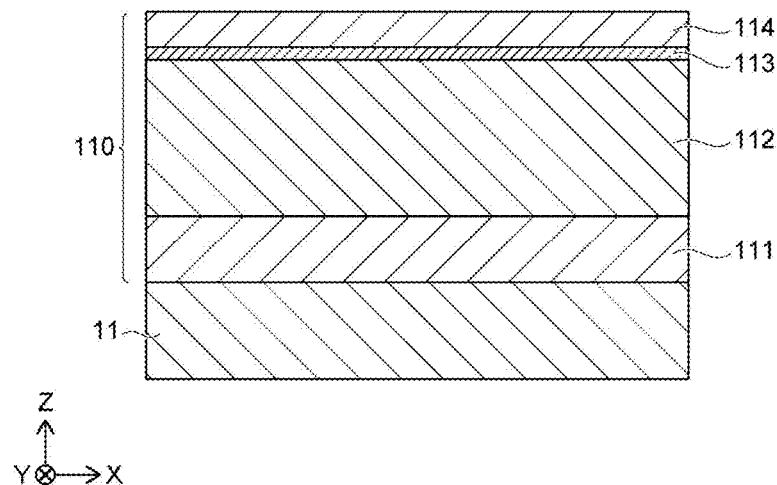
FIG. 5 is a cross-sectional view explaining the manufacturing process of the light-emitting element according to the embodiment.

FIG. 5 is a cross-sectional view illustrating the manufacturing process of the light-emitting element 10 according to the present embodiment.

Figure 6:
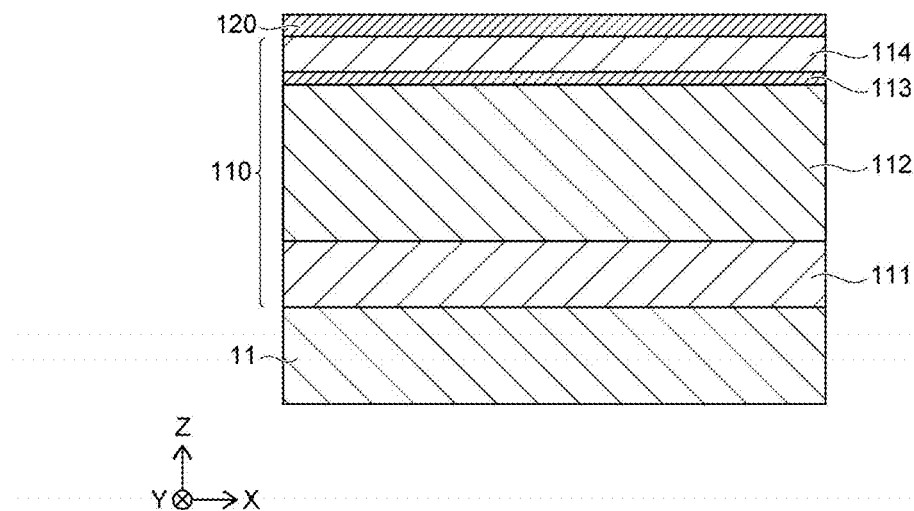
FIG. 6 is a cross-sectional view explaining the manufacturing process of the light-emitting element according to the embodiment.

FIG. 6 is a cross-sectional view illustrating the manufacturing process of the light-emitting element 10 according to the present embodiment.

Figure 7:
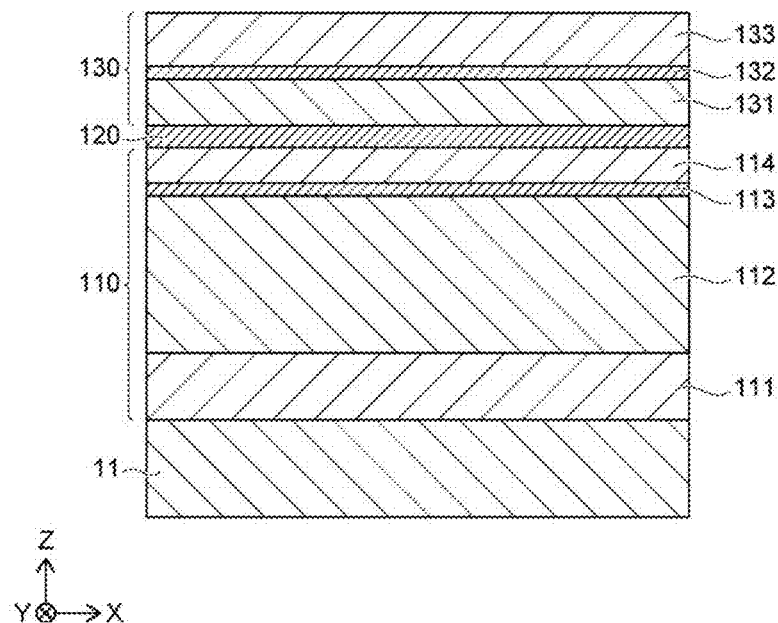
FIG. 7 is a cross-sectional view for explaining the manufacturing process of the light-emitting element according to the embodiment.

FIG. 7 is a cross-sectional view illustrating the manufacturing process of the light-emitting element 10 according to the present embodiment.

Figure 8:
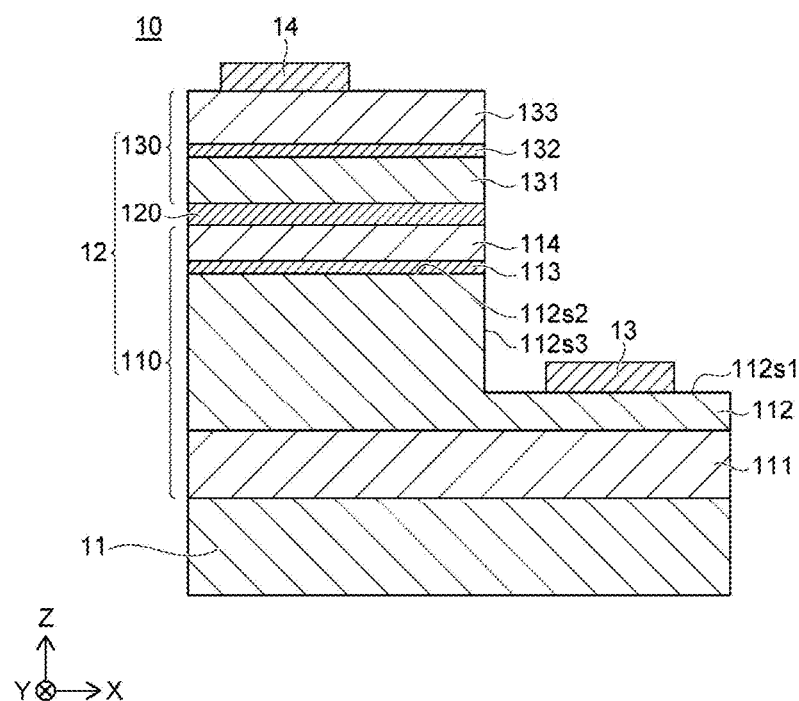
FIG. 8 is a cross-sectional view for explaining the manufacturing process of the light-emitting element according to the present embodiment.

FIG. 8 is a cross-sectional view illustrating the manufacturing process of the light-emitting element 10 according to the present embodiment.

The method for manufacturing the light-emitting element 10 is outlined with reference to FIG. 3. The method for manufacturing the light-emitting element 10 includes step S1 of forming a first light-emitting portion 110, step S2 of forming an intermediate layer 120, step S3 of forming a second light-emitting portion 130, and step S4 of forming the n-side electrode 13 and the p-side electrode 14.

The first light-emitting portion 110, the intermediate layer 120, and the second light-emitting portion 130 included in the semiconductor structure 12 are formed by metal organic chemical vapor deposition (MOCVD), for example. Specifically, the semiconductor structure 12 is formed by supplying a carrier gas and a raw material gas in the furnace.

Examples of the carrier gas include hydrogen ($H_2$) gas or nitrogen ($N_2$) gas.

The raw material gas is appropriately selected according to the semiconductor layer to be formed. In a case of forming the semiconductor layer including Ga, a raw material gas including Ga such as, for example, trimethylgallium (TMG) gas or triethylgallium (TEG) gas is used. In a case of forming the semiconductor layer including N, a raw material gas including N such as, for example, ammonia ($NH_3$) gas is used. In a case of forming the semiconductor layer including Al, a raw material gas including Al such as, for example, trimethylaluminum (TMA) gas is used. In a case of forming the semiconductor layer including In, a raw material gas including In such as, for example, trimethyl indium (TMI) gas is used. In a case of forming the semiconductor layer including Si, a raw material gas including Si such as, for example, monosilane ($SiH_4$) gas is used. In a case of forming the semiconductor layer including Mg is formed, a raw material gas including Mg such as, for example, biscyclopentadienyl magnesium ($Cp_2Mg$) gas is used. In the following, supplying the raw material gas including one element and the raw material gas including another element in the furnace will also simply be referred to as "supplying the raw material gas including one element and another element." The steps are described below.

First, the first light-emitting portion 110 is formed in step S1.

Step S1 of forming the first light-emitting portion 110 includes step S11 of forming the base layer 111, step S12 of forming the first n-side layer 112, and step S13 of forming the first active layer 113, and step S14 of forming the first p-side layer 114.

In step S11 of forming the base layer 111, the carrier gas and the raw material gas corresponding to the base layer 111 are supplied in the furnace. Accordingly, the base layer 111 is formed on the substrate 11.

In step S12 of forming the first n-side layer 112, the carrier gas and the raw material gas corresponding to the first n-side layer 112 are supplied in the furnace. Accordingly, the first n-side layer 112 is formed on the base layer 111.

In step S13 of forming the first active layer 113, the carrier gas and the raw material gas corresponding to the first active layer 113 are supplied in the furnace. Accordingly, the first active layer 113 is formed on the first n-side layer 112.

As illustrated in FIG. 4A, step S14 of forming the first p-side layer 114 includes step S14a of forming the first layer 114a, step S14b of forming the fifth layer 114b, step S14c of forming the second layer 114c, step S14d of forming the sixth layer 114d, and step S14e of forming the seventh layer 114e.

In step S14a of forming the first layer 114a, for example, the raw material gas including Al, Ga, and N, and the raw material gas including Mg, which is a p-type impurity, are supplied in the furnace. Accordingly, the first layer 114a including Mg-doped AlGaN is formed on the first active layer 113.

In step S14b of forming the fifth layer 114b, for example, the raw material gas including Al, Ga, and N is supplied in the furnace. At this time, no raw material gas including the n-type impurity and the p-type impurity is supplied. Accordingly, the fifth layer 114b including undoped AlGaN is formed on the first layer 114a.

In the present embodiment, the flow rate of the raw material gas including Ga when forming the fifth layer 114b is approximately the same as the flow rate of the raw material gas including Ga when forming the first layer 114a. The flow rate of the raw material gas including N when forming the fifth layer 114b is approximately the same as the flow rate of the raw material gas including N when forming the first layer 114a. The flow rate of the raw material gas including Al when forming the fifth layer 114b is approximately the same as the flow rate of the raw material gas including Al when forming the first layer 114a. Thus, the value of the composition ratio of Al in the fifth layer 114b is approximately the same as the value of the composition ratio of Al in the first layer 114a.

In the step S14c of forming the second layer 114c, for example, the raw material gas including Al, Ga, and N and the raw material gas including Mg as the p-type impurity, are supplied in the furnace. Accordingly, the second layer 114c including the Mg-doped AlGaN is formed on the fifth layer 114b.

In the present embodiment, the flow rate of the raw material gas including Ga when forming the second layer 114c is approximately the same as the flow rate of the raw material gas including Ga when forming the first layer 114a. The flow rate of the raw material gas including N when forming the second layer 114c is approximately the same as the flow rate of the raw material gas including N when forming the first layer 114a. The flow rate of the raw material gas including Al when forming the second layer 114c is greater than the flow rate of the raw material gas including Al when forming the first layer 114a. Thus, the value of the composition ratio of Al in the second layer 114c can be greater than the value of the composition ratio of Al in the first layer 114a.

Furthermore, in the present embodiment, the flow rate of the raw material gas including Mg when forming the second layer 114c is less than the flow rate of the raw material gas including Mg when forming the first layer 114a. Thus, the second p-type impurity concentration can be less than the first p-type impurity concentration.

In step S14d of forming the sixth layer 114d, for example, the raw material gas including Ga and N is supplied in the furnace. At this time, no raw material gas including the n-type impurity and the p-type impurity is supplied. Accordingly, the sixth layer 114d including undoped GaN is formed on the second layer 114c.

In step S14e of forming the seventh layer 114e, for example, the undoped semiconductor layer and the p-type semiconductor layer are formed. The undoped semiconductor layer is formed by supplying the raw material gas including Ga and N while supplying no raw material gas including n-type impurity and p-type impurity, in the furnace. The p-type semiconductor layer is formed by supplying the raw material gas including Ga and N and the raw material gas including Mg as p-type impurity in the furnace.

Thus, as illustrated in FIG. 5, the first light-emitting portion 110 including the base layer 111, the first n-side layer 112, the first active layer 113, and the first p-side layer 114 is formed on the substrate 11.

Subsequently, step S2 of forming the intermediate layer 120 is performed.

In step S2 of forming the intermediate layer 120, for example, the carrier gas, the raw material gas including Ga and N, and the raw material gas including Si as n-type impurity are supplied in the furnace. Accordingly, as illustrated in FIG. 6, the intermediate layer 120 is formed on the first light-emitting portion 110. Note that the intermediate layer 120 may be formed by molecular beam epitaxy (MBE) instead of MOCVD.

Subsequently, the second light-emitting portion 130 is formed in step S3.

As illustrated in FIG. 3, step S3 of forming the second light-emitting portion 130 includes step S31 of forming the second n-side layer 131, step S32 of forming the second active layer 132, and step S33 of forming the second p-side layer 133.

In step S31 of forming the second n-side layer 131, the carrier gas and the raw material gas corresponding to the second n-side layer 131 are supplied in the furnace. Accordingly, the second n-side layer 131 is formed on the intermediate layer 120.

In step S32 of forming the second active layer 132, the carrier gas and the raw material gas corresponding to the second active layer 132 are supplied in the furnace. Accordingly, the second active layer 132 is formed on the second n-side layer 131.

As illustrated in FIG. 4B, step S33 of forming the second p-side layer 133 includes step S33a of forming the third layer 133a, step S33b of forming the eighth layer 133b, step S33c of forming the fourth layer 133c, step S33d of forming the ninth layer 133d, and step S33e of forming the tenth layer 133e.

In step S33a of forming the third layer 133a, for example, the raw material gas including Al, Ga, and N, and the raw material gas including Mg as p-type impurity are supplied in the furnace. Accordingly, the third layer 133a including the Mg-doped AlGaN is formed on the second active layer 132.

In the present embodiment, the flow rate of the raw material gas including Ga when forming the third layer 133a is approximately the same as the flow rate of the raw material gas including Ga when forming the first layer 114a. The flow rate of the raw material gas including N when forming the third layer 133a is approximately the same as the flow rate of the raw material gas including N when forming the first layer 114a. The flow rate of the raw material gas including Al when forming the third layer 133a is less than the flow rate of the raw material gas including Al when forming the first layer 114a. Thus, the value of the composition ratio of Al in the third layer 133a is less than the value of the composition ratio of Al in the first layer 114a.

In the present embodiment, the flow rate of the raw material gas including Mg when forming the third layer 133a is greater than the flow rate of the raw material gas including Mg when forming the first layer 114a. Therefore, the third p-type impurity concentration can be greater than the first p-type impurity concentration.

In step S33b of forming the eighth layer 133b, the raw material gas including Al, Ga, and N is supplied in the furnace, for example. At this time, no raw material gas including the n-type impurity or p-type impurity is supplied. Accordingly, the eighth layer 133b including undoped AlGaN is formed on the third layer 133a.

In the present embodiment, the flow rate of the raw material gas including Ga when forming the eighth layer 133b is approximately the same as the flow rate of the raw material gas including Ga when forming the third layer 133a. The flow rate of the raw material gas including N when forming the eighth layer 133b is approximately the same as the flow rate of the raw material gas including N when forming the third layer 133a. The flow rate of the raw material gas including Al when forming the eighth layer 133b is the same as the flow rate of the raw material gas including Al when forming the third layer 133a. Thus, the value of the composition ratio of Al in the eighth layer 133b is approximately the same as the value of the composition ratio of Al in the third layer 133a.

In step S33c of forming the fourth layer 133c, for example, the raw material gas including Al, Ga, and N, and the raw material gas including Mg as p-type impurity are supplied in the furnace. Accordingly, the fourth layer 133c including Mg-doped AlGaN is formed on the eighth layer 133b.

In the present embodiment, the flow rate of the raw material gas including Ga when forming the fourth layer 133c is the same as the flow rate of the raw material gas including Ga when forming the first layer 114a. The flow rate of the raw material gas including N when forming the fourth layer 133c is the same as the flow rate of the raw material gas including N when forming the first layer 114a. The flow rate of the raw material gas including Al when forming the fourth layer 133c is greater than the flow rate of the raw material gas including Al when forming the first layer 114a, and is less than the flow rate of the raw material gas including Al when forming the second layer 114c. Thus, the value of the composition ratio of Al in the fourth layer 133c can be greater than the value of the composition ratio of Al in the first layer 114a, and less than the value of the composition ratio of Al in the second layer 114c.

Furthermore, in the present embodiment, the flow rate of the raw material gas including Mg when forming the fourth layer 133c is less than the flow rate of the raw material gas including Mg when forming the third layer 133a, and is greater than the flow rate of the raw material gas including Mg when forming the second layer 114c. Thus, the fourth p-type impurity concentration can be less than the third p-type impurity concentration and greater than the second p-type impurity concentration.

In step S33d of forming the ninth layer 133d, for example, the raw material gas including Ga and N is supplied in the furnace. At this time, no raw material gas including the n-type impurity and the p-type impurity is supplied. Accordingly, the ninth layer 133d including undoped GaN is formed on the fourth layer 133c. Alternatively, at this time, the raw material gas including the p-type impurity such as Mg may be supplied.

In step S33e of forming the tenth layer 133e, for example, the undoped semiconductor layer and the p-type semiconductor layer are formed. The undoped semiconductor layer is formed by supplying the raw material gas including Ga and N and not supplying the raw material gas including the n-type impurity and p-type impurity, in the furnace. The p-type semiconductor layer is formed by supplying the raw material gas including Ga and N and the raw material gas including Mg as p-type impurity in the furnace.

Thus, as illustrated in FIG. 7, the second light-emitting portion 130 including the second n-side layer 131, the second active layer 132, and the second p-side layer 133 is formed on the intermediate layer 120.

Subsequently, the n-side electrode 13 and the p-side electrode 14 are formed in step S4. First, in step S4 of forming the n-side electrode 13 and the p-side electrode 14, as illustrated in FIG. 8, the semiconductor structure 12 is partially removed to expose the first surface 112s1 and the third surface 112s3 of the first n-side layer 112 from the first active layer 113, the first p-side layer 114, the intermediate layer 120, and the second light-emitting portion 130. The semiconductor structure 12 can be partially removed by selective etching, for example, using a resist.

Subsequently, the n-side electrode 13 is formed on the exposed first surface 112s1. Also, the p-side electrode 14 is formed on the second p-side layer 133. The n-side electrode 13 and the p-side electrode 14 can be formed by sputtering or vapor deposition, for example.

Thus, the light-emitting element 10 is obtained. However, the method for manufacturing the light-emitting element 10 is not limited to the above. For example, the method for manufacturing the light-emitting element 10 may not include step S11 of forming the base layer 111 and, instead, the first n-side layer 112 may be directly formed on the substrate 11.

Next, the effect of the present embodiment is described.

The light-emitting element 10 according to the present embodiment includes the first light-emitting portion 110, the intermediate layer 120, and the second light-emitting portion 130. The first light-emitting portion 110 includes the first n-side layer 112, the first active layer 113, and the first p-side layer 114 disposed in this order upward from a lower side, each layer including a nitride semiconductor. The intermediate layer 120 is disposed over the first light-emitting portion 110 and is made of the nitride semiconductor including the n-type impurity. The second light-emitting portion 130 is disposed over the intermediate layer 120. The second light-emitting portion 130 includes the second n-side layer 131, the second active layer 132, and the second p-side layer 133 disposed in this order upward from a lower side, each layer including a nitride semiconductor. The n-type impurity concentration in the intermediate layer 120 is greater than the n-type impurity concentration in the first n-side layer 112. The first p-side layer 114 includes the first layer 114a including Al and Ga and having the first p-type impurity concentration, and includes also the second layer 114c, disposed above the first layer 114a, including Al and Ga, and having the second p-type impurity concentration. The value of the composition ratio of Al in the second layer 114c is greater than the value of the composition ratio of Al in the first layer 114a. The second p-type impurity concentration is less than the first p-type impurity concentration.

Thus, the value of the composition ratio of Al in the second layer 114c is greater than the value of the Al composition ratio in the first layer 114a. This improves the hole injection efficiency from the first p-side layer 114 to the first active layer 113, while the second layer 114c functions as the electron blocking layer. Furthermore, because the second p-type impurity concentration is less than the first p-type impurity concentration, the amount of p-type impurities that diffuse from the first p-side layer 114 toward the intermediate layer 120 can be reduced. This improves the hole injection efficiency from the first p-side layer 114, which has the first p-type impurity concentration greater than the second p-type impurity concentration, to the first active layer 113. In view of the above, the forward voltage Vf of the light-emitting element 10 can be reduced.

The second p-side layer 133 includes the third layer 133a including Al and Ga and having the third p-type impurity concentration, and includes also the fourth layer 133c, disposed above the third layer 133a, including Al and Ga, and having the fourth p-type impurity concentration. The value of the composition ratio of Al in the fourth layer 133c is greater than the value of the composition ratio of Al in the third layer 133a. The fourth p-type impurity concentration is less than the third p-type impurity concentration. Thus, the value of the composition ratio of Al in the third layer 133a is greater than the value of the Al composition ratio in the fourth layer 133c. This improves the hole injection efficiency from the third layer 133a to the second active layer 132, while the fourth layer 133c functions as the electron blocking layer. Furthermore, because the third p-type impurity concentration is greater than the fourth p-type impurity concentration, the hole injection efficiency from the second p-side layer 133 to the second active layer 132 can be improved. Further, for example, when the light-emitting element 10 is driven at a high temperature of 100° C. or higher, the decrease in output of the light-emitting element 10 can be reduced.

Also, the value of the composition ratio of Al in the fourth layer 133c is less than the value of the composition ratio of Al in the second layer 114c, and the value of the composition ratio of Al in the third layer 133a is less than the value of the composition ratio of Al in the first layer 114a. This facilitates supplying of holes to the second active layer 132, and reduces the forward voltage Vf.

Also, the first p-type impurity concentration is less than the third p-type impurity concentration, and the second p-type impurity concentration is less than the fourth p-type impurity concentration. This improves the hole injection efficiency from the second p-side layer 133 to the second active layer 132 while reducing the amount of the p-type impurities that diffuse from the first p-side layer 114 to the intermediate layer 120.

Examples

Next, examples and a reference example are described.

Light-emitting elements according to the reference example and the examples 1 to 3 were formed. The light-emitting elements according to the reference example and the examples 1 to 3 have a layer structure similar to that of the light-emitting element 10 illustrated in FIG. 1. The light-emitting elements according to the reference example and the examples 1 to 3 were formed with the first layer, the fifth layer, and the second layer of the first p-side layer, and the third layer, the eighth layer, and the fourth layer of the second p-side layer formed at the flow rates of the raw material gas including Al and the raw material gas including Mg shown in the table below, while the other layers were commonly formed.

first n-side layer. The first active layer was formed to include seven pairs of the barrier layer and the well layer.

Subsequently, a first p-side layer including first, fifth, second, sixth, and seventh layers was formed on the first active layer.

The first layer included a Mg-doped AlGaN layer. The thickness of the first layer was about 5 nm. In the reference example and the examples 1 to 3, the flow rate of the raw material gas including Ga when forming the first layer was approximately the same, and the flow rate of the raw material gas including N when forming the first layer was approximately the same. Also, in each of the reference example and the examples 1 to 3, the flow rate of the raw material gas including Al when forming the first layer was approximately the same at F1.

In the reference example, the flow rate of the raw material gas including Mg when forming the first layer was F3. In the examples 1 to 3, the flow rate of the raw material gas including Mg when forming the first layer was 1.25 times the flow rate F3.

The fifth layer included undoped AlGaN. The thickness of the fifth layer was about 2 nm. In the reference example and the examples 1 to 3, the flow rate of the raw material gas including Ga when forming the fifth layer was approximately the same as the flow rate of the raw material gas including Ga when forming the first layer, the flow rate of the raw material gas including N when forming the fifth layer was approximately the same as the flow rate of the raw material gas including N when forming the first layer, and the flow rate of the raw material gas including Al when forming the fifth layer was approximately the same as the flow rate of the raw material gas including Al when forming the first layer. Thus, in each of the reference example and the examples 1 to 3, the value of the composition ratio of Al in the fifth layer was approximately the same as the value of the composition ratio of Al in the first layer.

TABLE 1

| | FLOW RATE OF RAW MATERIAL GAS INCLUDING Al | | | | | | FLOW RATE OF RAW MATERIAL GAS INCLUDING Mg | | | | | |
|---|---|---|---|---|---|---|---|---|---|---|---|---|
| | FIRST P-SIDE LAYER | | | SECOND P-SIDE LAYER | | | FIRST P-SIDE LAYER | | | SECOND P-SIDE LAYER | | |
| | FIRST LAYER | FIFTH LAYER | SECOND LAYER | THIRD LAYER | EIGHTH LAYER | FOURTH LAYER | FIRST LAYER | FIFTH LAYER | SECOND LAYER | THIRD LAYER | EIGHTH LAYER | FOURTH LAYER |
| REFERENCE EXAMPLE | F1 | F1 | F2 | F1 | F1 | F2 | F3 | 0 | F3 | F3 | 0 | F3 |
| EXAMPLE 1 | F1 | F1 | F2 | F1 | F1 | F2 | F3 × 1.25 | 0 | F3 × 0.5 | F3 × 1.25 | 0 | F3 × 0.5 |
| EXAMPLE 2 | F1 | F1 | F2 | F1 | F1 | F2 | F3 × 1.25 | 0 | F3 × 0.5 | F3 × 1.5 | 0 | F3 × 1.5 |
| EXAMPLE 3 | F1 | F1 | F2 | F1 × 0.75 | F1 × 0.75 | F2 × 0.75 | F3 × 1.25 | 0 | F3 × 0.5 | F3 × 1.25 | 0 | F3 × 0.5 |

In the table shown above, the flow rate F2 is greater than the flow rate F1. A method for manufacturing the light-emitting elements according to the reference example and the examples 1 to 3 is described below.

First, a base layer having a thickness of approximately 5 m including an undoped GaN layer was formed on a substrate made of sapphire.

Subsequently, a first n-side layer having a thickness of approximately 5.5 m including Si-doped GaN layer and an undoped GaN layer on the base layer was formed.

Subsequently, a first active layer having a thickness of approximately 50 nm and including a plurality of barrier layers including undoped GaN layers and a plurality of well layers including undoped InGaN layers was formed on the The second layer included Mg-doped AlGaN. The thickness of the second layer was about 5 nm. In the reference example and the examples 1 to 3, the flow rate of the raw material gas including Ga when forming the second layer was the same as the flow rate of the raw material gas including Ga when forming the first layer, and the flow rate of the raw material gas including N when forming the second layer was the same as the flow rate of the raw material gas including N when forming the first layer. Also, in any of the reference example and the examples 1 to 3, the flow rate of the raw material gas including Al when forming the second layer was F2 that was greater than the flow rate F1. Thus, in any of the reference example and the examples 1 to 3, the value of the composition ratio of Al in the second layer was greater than the value of the composition ratio of Al in the first layer.

In the reference example, the flow rate of the raw material gas including Mg when forming the second layer was the same as the flow rate F3 which was the flow rate of the raw material gas including Mg when forming the first layer. Thus, in the reference example, the second p-type impurity concentration was approximately the same as the first p-type impurity concentration.

In the examples 1 to 3, the flow rate of the raw material gas including Mg when forming the second layer was 0.5 times the flow rate F3. Therefore, in the examples 1 to 3, the second p-type impurity concentration was less than the first p-type impurity concentration.

The sixth layer included undoped GaN. The thickness of the sixth layer was about 3 nm.

The seventh layer included undoped GaN and Mg-doped GaN. The thickness of the seventh layer was about 70 nm.

Subsequently, an intermediate layer having the thickness of approximately 140 nm and including a Si-doped GaN layer was formed on the first p-side layer.

Subsequently, a second n-side layer having the thickness of approximately 56 nm and including the InGaN layer doped with a plurality of Si and the GaN layer doped with a plurality of Si was formed on the intermediate layer.

Subsequently, a second active layer having the thickness of approximately 50 nm and including a plurality of barrier layers made of undoped GaN and a plurality of well layers including undoped InGaN was formed on the second n-side layer. The second active layer was formed to include seven pairs of the barrier layer and the well layer.

Subsequently, a second p-side layer including third, eighth, fourth, ninth, and tenth layers was formed on the second active layer.

The third layer included Mg-doped AlGaN. The thickness of the third layer was about 5 nm. In the reference example and the examples 1 to 3, the flow rate of the raw material gas including Ga when forming the third layer was approximately the same as the flow rate of the raw material gas including Ga when forming the first layer, and the flow rate of the raw material gas including N when forming the third layer was approximately the same as the flow rate of the raw material gas including N when forming the first layer.

In the reference example and the examples 1 and 2, the flow rate of the raw material gas including Al when forming the third layer was F1 which was the same flow rate as the flow rate of the raw material gas including Al when forming the first layer. Thus, in the reference example and the examples 1 and 2, the value of the composition ratio of Al in the third layer was approximately the same as the value of the composition ratio of Al in the first layer.

In the example 3, the flow rate of the raw material gas including Al when forming the third layer was 0.75 times the flow rate F1. That is, in the example 3, the value of the composition ratio of Al in the third layer was less than the value of the composition ratio of Al in the first layer.

In the reference example, the flow rate of the raw material gas including Mg when forming the third layer was the same flow rate F3 as the flow rate of the raw material gas when forming the first layer. In the examples 1 and 3, the flow rate of the raw material gas including Mg when forming the third layer was 1.25 times the flow rate F3. That is, in the reference example and the examples 1 and 3, the third p-type impurity concentration was approximately the same as the first p-type impurity concentration.

In the example 2, the flow rate of the raw material gas including Mg when forming the third layer was 1.5 times the flow rate F3. That is, in the example 2, the third p-type impurity concentration was greater than the first p-type impurity concentration.

The eighth layer included undoped AlGaN. The thickness of the eighth layer was about 2 nm. In the reference example and the examples 1 to 3, the flow rate of the raw material gas including Ga when forming the eighth layer was approximately the same as the flow rate of the raw material gas including Ga when forming the third layer, the flow rate of the raw material gas including N when forming the eighth layer was approximately the same as the flow rate of the raw material gas including N when forming the third layer, and the flow rate of the raw material gas including Al when forming the eighth layer was approximately the same as the flow rate of the raw material gas including Al when forming the third layer. Therefore, in each of the reference example and the examples 1 to 3, the value of the composition ratio of Al in the eighth layer was approximately the same as the value of the composition ratio of Al in the third layer.

The fourth layer included Mg doped AlGaN. The thickness of the fourth layer was about 5 nm. In the reference example and the examples 1 to 3, the flow rate of the raw material gas including Ga when forming the fourth layer was the same as the flow rate of the raw material gas including Ga when forming the third layer, and the flow rate of the raw material gas including N when forming the fourth layer was the same as the flow rate of the raw material gas including N when forming the third layer.

In the reference example and the examples 1 and 2, the flow rate of the raw material gas including Al when forming the fourth layer was F2, which was greater than the flow rate F1 of the raw material gas including Al when forming the third layer, and which was the same as the flow rate of the raw material gas including Al when forming the second layer. Thus, in the reference example and the examples 1 and 2, the value of the composition ratio of Al in the fourth layer was greater than the value of the composition ratio of Al in the third layer, and was approximately the same as the value of the composition ratio of Al in the second layer.

In the example 3, the flow rate of the raw material gas including Al when forming the fourth layer was 0.75 times the flow rate F2. Thus, in the example 3, the value of the composition ratio of Al in the fourth layer was greater than the value of the composition ratio of Al in the third layer, and was less than the value of the composition ratio of Al in the second layer.

In the reference example, the flow rate of the raw material gas including Mg when forming the fourth layer was F3 that was approximately the same as the flow rate of the raw material gas including Mg when forming the first layer, the second layer, and the third layer. Thus, in the reference example, the fourth p-type impurity concentration was approximately the same as the second p-type impurity concentration and the third p-type impurity concentration.

In the examples 1 and 3, the flow rate of the raw material gas including Mg when forming the fourth layer was 0.5 times the flow rate F3. Thus, in the examples 1 and 3, the fourth p-type impurity concentration was approximately the same as the second p-type impurity concentration, and was less than the third p-type impurity concentration.

In the example 2, the flow rate of the raw material gas including Mg when forming the fourth layer was 1.5 times the flow rate F3. That is, in the example 2, the fourth p-type impurity concentration was greater than the second p-type impurity concentration, and was approximately the same as the third p-type impurity concentration.

The ninth layer included the undoped GaN layer. The thickness of the ninth layer was about 3 nm.

The tenth layer included the undoped GaN layer and the Mg-doped GaN layer. The thickness of the tenth layer was approximately 100 nm.

Subsequently, the first n-side layer, the first active layer, the first p-side layer, the intermediate layer, the second n-side layer, the second active layer, and the second p-side layer were partially removed to form the n-side electrode on the exposed first n-side layer and the p-side electrode on the exposed second p-side layer.

Figure 9A:
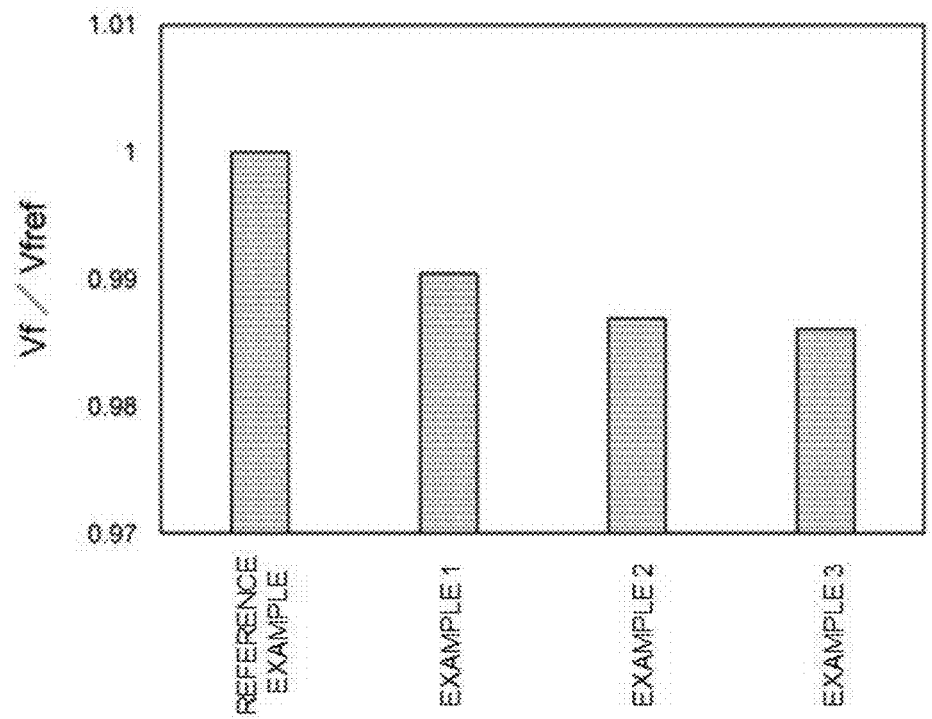
FIG. 9A is a graph showing normalized values Vf/Vfref representing forward voltage Vf for each of light-emitting elements according to a reference example and examples 1 to 3.

FIG. 9A is a graph showing Vf/Vfref values representing normalized values of the forward voltage Vf of each of the light-emitting elements according to the reference example and the examples 1 to 3.

Figure 9B:
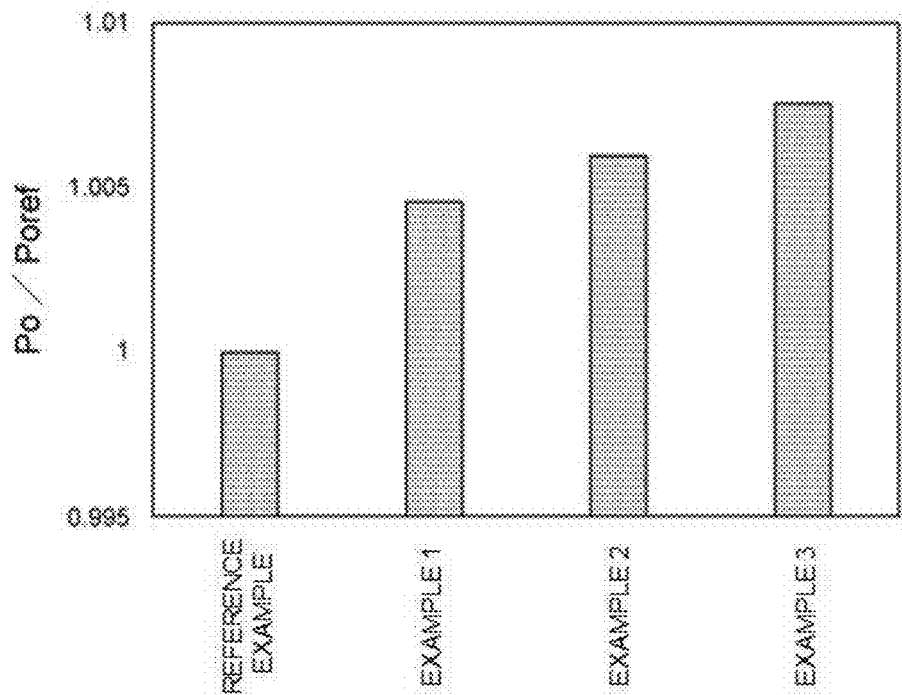
FIG. 9B is a graph showing normalized values Po/Poref representing output Po for each of light-emitting elements according to the reference example and the examples 1 to 3.

FIG. 9B is a graph showing Po/Poref values representing normalized values of the output Po of each of the light-emitting elements according to the reference example and the examples 1 to 3.

The forward voltage Vf of each of the light-emitting elements according to the reference example and the examples 1 to 3 was measured. The results are shown in FIG. 9A. The vertical axis of FIG. 9A represents the normalized value obtained by dividing the measured forward voltage Vf by the reference forward voltage Vfref, in which the forward voltage Vf of the reference example is the reference forward voltage Vfref.

Similarly, the output Po of each light-emitting element according to the reference example and the examples 1 to 3 which have been formed was measured. The results are shown in FIG. 9B. The vertical axis of FIG. 9B represents the normalized value obtained by dividing the measured output Po by the reference output Poref, in which the output Po of the reference example is the reference output Poref.

The forward voltage Vf of the example 1 is less than the forward voltage Vf of the reference example, and the output Po of the example 1 is greater than the output Po of the reference example. The example 1 differs from the reference example in that the second p-type impurity concentration is less than the first p-type impurity concentration, and the fourth p-type impurity concentration is less than the third p-type impurity concentration. In the example 1, the amount of Mg that diffuses from the first p-side layer to the intermediate layer 120 side can be reduced by lowering the second p-type impurity concentration below the first p-type impurity concentration. This is considered to have improved the hole injection efficiency from the first p-side layer, which has the first p-type impurity concentration greater than the second p-type impurity concentration, to the first active layer. This is also considered to have improved the hole injection efficiency from the second p-side layer to the second active layer by increasing the third p-type impurity concentration greater than the fourth p-type impurity concentration. Thus, this is considered to have lowered the forward voltage Vf and improved the output Po. Preferably, therefore, the second p-type impurity concentration is less than the first p-type impurity concentration, and the fourth p-type impurity concentration is less than the third p-type impurity concentration.

In addition, the forward voltage Vf of the example 2 is less than the forward voltage Vf of the example 1, and the output Po of the example 2 is greater than the output Po of the example 1. The example 2 differs from the example 1 in that the third p-type impurity concentration is greater than the first p-type impurity concentration, and the fourth p-type impurity concentration is greater than the second p-type impurity concentration. In the example 2, this is considered to have improved the hole injection efficiency from the second p-side layer to the second active layer while reducing the amount of Mg that diffuses from the first p-side layer toward the intermediate layer by increasing the third p-type impurity concentration greater than the first p-type impurity concentration, and increasing the fourth p-type impurity concentration greater than the second p-type impurity concentration. Thus, this is considered to have lowered the forward voltage Vf and improved the output Po. Preferably, therefore, the third p-type impurity concentration is greater than the first p-type impurity concentration, and the fourth p-type impurity concentration is preferably greater than the second p-type impurity concentration.

In addition, the forward voltage Vf of the example 3 is less than the forward voltage Vf of the example 1, and the output Po of the example 3 is greater than the output Po of the example 1. The example 3 differs from the example 1 in that the value of the composition ratio of Al in the third layer is less than the value of the composition ratio of Al in the first layer, and the value of the composition ratio of Al of the fourth layer is less than the value of the composition ratio of Al in the second layer. This is considered to have facilitated supplying of holes to the second active layer and reduced the forward voltage Vf in the example 3. Preferably, therefore, the value of the composition ratio of Al in the third layer is less than the value of the composition ratio of Al in the first layer, and the value of the composition ratio of Al in the fourth layer is less than the value of the composition ratio of Al in the second layer.

What is claims:

1. A light-emitting element comprising:
    a first light-emitting portion comprising, in order upward from a lower side, a first n-side layer, a first active layer, and a first p-side layer disposed, each made of a nitride semiconductor;
    an intermediate layer disposed over the first light-emitting portion and made of a nitride semiconductor including an n-type impurity; and
    a second light-emitting portion disposed over the intermediate layer and comprising, in order upward from a lower side, a second n-side layer, a second active layer, and a second p-side layer, each made of a nitride semiconductor; wherein:
    an n-type impurity concentration in the intermediate layer is greater than an n-type impurity concentration in the first n-side layer;
    the first p-side layer comprises:
        a first layer including aluminum and gallium, and having a first p-type impurity concentration, and
        a second layer disposed above the first layer, including aluminum and gallium, and having a second p-type impurity concentration;
    a value of a composition ratio of aluminum in the second layer is greater than a value of a composition ratio of aluminum in the first layer;
    the second p-type impurity concentration is less than the first p-type impurity concentration;
    the second p-side layer comprises:
        a third layer including aluminum and gallium, and having a third p-type impurity concentration, and
        a fourth layer disposed above the third layer, including aluminum and gallium, and having a fourth p-type impurity concentration;

a value of a composition ratio of aluminum in the fourth layer is greater than a value of a composition ratio of aluminum in the third layer;

the fourth p-type impurity concentration is less than the third p-type impurity concentration;

the value of the composition ratio of aluminum in the fourth layer is less than the value of the composition ratio of aluminum in the second layer; and the value of the composition ratio of aluminum in the third layer is less than a value of the composition ratio of aluminum in the first layer.

2. The light-emitting element according to claim 1, wherein:
the first p-type impurity concentration is less than the third p-type impurity concentration; and
the second p-type impurity concentration is less than the fourth p-type impurity concentration.

3. The light-emitting element according to claim 1, wherein:
the value of the composition ratio of aluminum in the first layer is in a range from 3% to 7%; and
the value of the composition ratio of aluminum in the second layer is in a range from 8% to 25%.

4. The light-emitting element according to claim 3, wherein:
the first p-type impurity concentration is in a range from $1\times10^{20}$ cm$^{-3}$ to $3\times10^{20}$ cm$^{-3}$; and
the second p-type impurity concentration is in a range from $4\times10^{19}$ cm$^{-3}$ to $1\times10^{20}$ cm$^{-3}$.

5. A method for manufacturing a light-emitting element, the method comprising:
forming a first light-emitting portion comprising, in order upward from a lower side, a first n-side layer, a first active layer, and a first p-side layer, each made of a nitride semiconductor;
forming an intermediate layer disposed over the first light-emitting portion and made of a nitride semiconductor layer including an n-type impurity; and
forming a second light-emitting portion disposed over the intermediate layer and comprising, in order upward from a lower side, a second n-side layer, a second active layer, and a second p-side layer, each made of a nitride semiconductor; wherein:
an n-type impurity concentration in the intermediate layer is greater than an n-type impurity concentration in the first n-side layer;
the step of forming the first p-side layer comprises:
forming a first layer including aluminum and gallium, and having a first p-type impurity concentration, and
forming a second layer disposed above the first layer, including aluminum and gallium, and having a second p-type impurity concentration;
a value of a composition ratio of aluminum in the second layer is greater than a value of a composition ratio of aluminum in the first layer;
the second p-type impurity concentration is less than the first p-type impurity concentration;
the step of forming the second p-side layer comprises:
forming a third layer including aluminum and gallium, and having a third p-type impurity concentration, and
forming a fourth layer disposed above the third layer, including aluminum and gallium, and having a fourth p-type impurity concentration;
a value of a composition ratio of aluminum in the fourth layer is greater than a value of a composition ratio of aluminum in the third layer;

the fourth p-type impurity concentration is less than the third p-type impurity concentration;

the value of the composition ratio of aluminum in the fourth layer is less than the value of the composition ratio of aluminum in the second layer; and the value of the composition ratio of aluminum in the third layer is less than the value of the composition ratio of the aluminum in the first layer.

6. The method for manufacturing the light-emitting element according to claim 5, wherein:
the first p-type impurity concentration is less than the third p-type impurity concentration; and
the second p-type impurity concentration is less than the fourth p-type impurity concentration.

7. The method for manufacturing the light-emitting element according to claim 5, wherein:
the value of the composition ratio of aluminum in the second layer is in a range from 8% to 25%; and
the value of the composition ratio of aluminum in the first layer is in a range from 3% to 7%.

8. The method for manufacturing the light-emitting element according to claim 7, wherein:
the first p-type impurity concentration is in a range from $1\times10^{20}$ cm$^{-3}$ to $3\times10^{20}$ cm$^{-3}$; and
the second p-type impurity concentration is in a range from $4\times10^{19}$ cm$^{-3}$ to $1\times10^{20}$ cm$^{-3}$.

9. A light-emitting element comprising:
a first light-emitting portion comprising, in order upward from a lower side, a first n-side layer, a first active layer, and a first p-side layer disposed, each made of a nitride semiconductor;
an intermediate layer disposed over the first light-emitting portion and made of a nitride semiconductor including an n-type impurity; and
a second light-emitting portion disposed over the intermediate layer and comprising, in order upward from a lower side, a second n-side layer, a second active layer, and a second p-side layer, each made of a nitride semiconductor; wherein:
an n-type impurity concentration in the intermediate layer is greater than an n-type impurity concentration in the first n-side layer;
the first p-side layer comprises:
a first layer including aluminum and gallium, and having a first p-type impurity concentration,
a second layer disposed above the first layer, including aluminum and gallium, and having a second p-type impurity concentration, and
a third layer disposed between the first layer and the second layer, including aluminum and gallium;
a value of a composition ratio of aluminum in the second layer is greater than a value of a composition ratio of aluminum in the first layer;
the second p-type impurity concentration is less than the first p-type impurity concentration; and
a thickness of the third layer is less than a thickness of the first layer.

10. A method for manufacturing a light-emitting element, the method comprising:
forming a first light-emitting portion comprising, in order upward from a lower side, a first n-side layer, a first active layer, and a first p-side layer, each made of a nitride semiconductor;
forming an intermediate layer disposed over the first light-emitting portion and made of a nitride semiconductor layer including an n-type impurity; and forming a second light-emitting portion disposed over the intermediate layer and comprising, in order upward from a lower side, a second n-side layer, a second active layer, and a second p-side layer, each made of a nitride semiconductor; wherein:

an n-type impurity concentration in the intermediate layer is greater than an n-type impurity concentration in the first n-side layer;

the step of forming the first p-side layer comprises:
  forming a first layer including aluminum and gallium, and having a first p-type impurity concentration,
  forming a second layer disposed above the first layer, including aluminum and gallium, and having a second p-type impurity concentration, and
  forming a third layer disposed between the first layer and the second layer, including aluminum and gallium;

a value of a composition ratio of aluminum in the second layer is greater than a value of a composition ratio of aluminum in the first layer;

the second p-type impurity concentration is less than the first p-type impurity concentration; and a thickness of the third layer is less than a thickness of the first layer.

* * * * *